(12) United States Patent
Kim

(10) Patent No.: US 10,332,945 B2
(45) Date of Patent: Jun. 25, 2019

(54) ORGANIC LIGHT-EMITTING DISPLAY APPARATUS

(71) Applicant: Samsung Display Co., Ltd., Yongin-si, Gyeonggi-do (KR)

(72) Inventor: Jeeeun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/787,040

(22) Filed: Oct. 18, 2017

(65) Prior Publication Data

US 2018/0166518 A1 Jun. 14, 2018

(30) Foreign Application Priority Data

Dec. 9, 2016 (KR) .................. 10-2016-0168008

(51) Int. Cl.
*H01L 51/52* (2006.01)
*H01L 27/32* (2006.01)
*H01L 51/05* (2006.01)

(52) U.S. Cl.
CPC ...... *H01L 27/3246* (2013.01); *H01L 27/3258* (2013.01); *H01L 27/3276* (2013.01); *H01L 51/0508* (2013.01); *H01L 51/5203* (2013.01)

(58) Field of Classification Search
CPC .................. H01L 51/5203; H01L 51/5209
See application file for complete search history.

(56) References Cited

U.S. PATENT DOCUMENTS

| | | | |
|---|---|---|---|
| 7,701,132 B2 | 4/2010 | Oh | |
| 7,843,125 B2 | 11/2010 | Smith et al. | |
| 8,293,636 B2 * | 10/2012 | Schulze | H01L 24/11 257/738 |
| 8,487,301 B2 * | 7/2013 | Choi | H01L 51/56 257/40 |
| 8,610,696 B2 * | 12/2013 | Kurokawa | G09G 3/3648 326/104 |
| 8,766,265 B2 * | 7/2014 | Lee | H01L 51/5265 257/59 |
| 9,048,454 B2 * | 6/2015 | Song | H01L 51/5228 |
| 9,093,669 B2 * | 7/2015 | Park | H01L 51/56 |
| 9,099,674 B2 | 8/2015 | Ha et al. | |

(Continued)

FOREIGN PATENT DOCUMENTS

KR 20030074089 A 9/2003
KR 1020060059722 A 6/2006
(Continued)

*Primary Examiner* — Nicholas J Tobergte
(74) *Attorney, Agent, or Firm* — Cantor Colburn LLP

(57) ABSTRACT

An organic light-emitting display apparatus includes a substrate; a common voltage line; a pixel including: a first area at which light is emitted and a contact area at which the common voltage line is electrically connected to the pixel; a via insulating layer including a contact via hole defined therein to expose a portion of the common voltage line; a pixel electrode in the first area of the pixel; a pixel-defining layer including a first opening defined therein to expose a portion of the pixel electrode; an intermediate layer on the exposed portion of the pixel electrode, the intermediate layer including an organic emission layer; and a counter electrode on the intermediate layer, the counter electrode in direct contact with the common voltage line at the contact via hole in the contact area.

20 Claims, 12 Drawing Sheets

(56) References Cited

U.S. PATENT DOCUMENTS

| | | | |
|---|---|---|---|
| 9,136,313 B2 | 9/2015 | Kim et al. | |
| 2018/0047920 A1* | 2/2018 | Jang | ........................ B32B 5/145 |

FOREIGN PATENT DOCUMENTS

| | | | |
|---|---|---|---|
| KR | 1020060085491 A | 7/2006 | |
| KR | 1020060109996 A | 10/2006 | |
| KR | 1020110095653 A | 8/2011 | |
| KR | 1020150040668 A | 4/2015 | |
| KR | 1020170047473 A | 5/2017 | |
| WO | 03075356 A1 | 9/2003 | |

* cited by examiner

ORGANIC LIGHT-EMITTING DISPLAY APPARATUS

This application claims priority to Korean Patent Application No. 10-2016-0168008, filed on Dec. 9, 2016, and all the benefits accruing therefrom under 35 U.S.C. § 119, the content of which in its entirety is herein incorporated by reference.

BACKGROUND

1. Field

One or more embodiments relate to an organic light-emitting display apparatus.

2. Description of the Related Art

An organic light-emitting display apparatus is a self-luminescent type display apparatus. The organic light-emitting display apparatus includes an organic light-emitting device including a hole injection electrode, an electron injection electrode, and an organic emission layer therebetween. The organic emission layer emits light as excitons, which are generated when holes injected from the hole injection electrode combine with electrons injected from the electron injection electrode in the organic emission layer, transition from an excited state to a ground state.

Since an organic light-emitting display apparatus, which is a self-luminescent type display apparatus, does not require a separate light source, the organic light-emitting display apparatus may be driven at a relatively low voltage, may be configured as a relatively light and thin display apparatus, and has excellent characteristics including a relatively high viewing angle and contrast, the organic light-emitting display apparatus is being applied to a wider range of products including personal portable devices, such as an MP3 player and a mobile phone, and televisions ("TVs").

SUMMARY

One or more embodiments include an organic light-emitting display apparatus of which quality is improved by reducing an irregular voltage drop ("IR") of a counter electrode and minimizing defects that may occur during a manufacturing process.

Additional features will be set forth in part in the description which follows and, in part, will be apparent from the description, or may be learned by practice of the presented embodiments.

According to one or more embodiments, an organic light-emitting display apparatus includes a substrate; a common voltage line on the substrate; a pixel on the substrate, the pixel including: a first area at which light is generated and emitted, and a contact area adjacent to the first area, at which the common voltage line is electrically connected to the pixel; a via insulating layer in the contact area of the pixel, on the common voltage line, the via insulating layer including a contact via hole defined therein to expose a portion of the common voltage line; a pixel electrode in the first area of the pixel; a pixel-defining layer in the first area of the pixel, the pixel-defining layer including a first opening defined therein to expose a portion of the pixel electrode in the first area of the pixel; an intermediate layer on the exposed portion of the pixel electrode, the intermediate layer including an organic emission layer at which the light is generated; and a counter electrode on the intermediate layer, the counter electrode in direct contact with the common voltage line at the contact via hole in the contact area.

According to an embodiment, a side surface of the via insulating layer at the contact via hole may have a stepped shape.

According to an embodiment, the intermediate layer on the exposed portion of the pixel electrode may extend to be disposed along a side surface of the via insulating layer at the contact via hole in the contact area of the pixel.

According to an embodiment, the intermediate layer may further include a common layer. The common layer may be on the organic emission layer, in the first area of the pixel, the common layer extending from the first area to the contact area of the pixel to expose the common voltage line at the contact via hole in the contact area.

According to an embodiment, the organic light-emitting display apparatus may further include a pixel circuit electrically connected to the pixel electrode to drive the pixel. The pixel circuit may include a thin-film transistor and a capacitor in the first area of the pixel.

According to an embodiment, the pixel may include a first sub-pixel, a second sub-pixel and a third sub-pixel, and within such pixel, the pixel electrode may include a first pixel sub-electrode, a second pixel sub-electrode and a third pixel sub-electrode that are disposed in the first sub-pixel, the second sub-pixel and the third sub-pixel, respectively.

According to an embodiment, within the pixel, the contact area may be an area adjacent to a pixel sub-electrode having the smallest planar area from among the first pixel sub-electrode, the second pixel sub-electrode and the third pixel sub-electrode.

According to an embodiment, the substrate may further include a second area through which external light is transmitted, and the pixel-defining layer may include a second opening defined therein corresponding to the second area.

According to an embodiment, the via insulating layer may further include a transmissive via hole defined therein corresponding to the second area, and a side surface of the via insulating layer at the transmissive via hole may have a stepped shape.

According to an embodiment, the pixel electrode may be a reflective electrode, and the counter electrode may be a transparent or semi-transparent electrode.

According to one or more embodiments, an organic light-emitting display apparatus includes a substrate; and a pixel on the substrate. The pixel includes: a common voltage line on the substrate; a first area at which light is generated and emitted; a second area at which external light is transmitted; a contact area between the first area and the second area, at which the common voltage line is electrically connected to the pixel; a pixel electrode in the first area; a pixel-defining layer in the first area, the pixel-defining layer including a first opening defined therein to expose a portion of the pixel electrode and a second opening defined therein corresponding to the second area; a via insulating layer on the common voltage line, the via insulating layer including a contact via hole defined therein to expose a portion of the common voltage line at the contact area and a transmissive via hole defined therein corresponding to the second area; an intermediate layer on the exposed portion of the pixel electrode in the first area, including an organic emission layer at which the light is generated; and a counter electrode on the intermediate layer, the counter electrode in direct contact with the common voltage line at the contact via hole in the via insulating layer.

According to an embodiment, a side surface of the via insulating layer at the contact via hole may have a stepped shape.

According to an embodiment, a side surface of the via insulating layer at the transmissive via hole may have a stepped shape.

According to an embodiment, the pixel electrode may include silver (Ag), and the common voltage line may not include silver (Ag).

According to an embodiment, the counter electrode directly contacting the common voltage line at the contact via hole in the via insulating layer may include an opening defined therein corresponding to the second area.

According to an embodiment, a ratio of a total planar area of the second area to a total planar area of the pixel may be from about 40% to about 90%.

According to an embodiment, a portion of the common voltage line directly connected to the counter electrode at the contact via hole in the via insulating layer may be disposed in the first area.

According to an embodiment, the pixel may include a first sub-pixel, a second sub-pixel and a third sub-pixel that emit light of different colors, and within the pixel, the pixel electrode may include a first pixel sub-electrode, a second pixel sub-electrode and a third pixel sub-electrode that are disposed in the first sub-pixel, the second sub-pixel and the third sub-pixel, respectively.

According to an embodiment, the first sub-pixel, the second sub-pixel and the third sub-pixel may emit red light, green light and blue light, respectively, and the first pixel sub-electrode, the second pixel sub-electrode and the third pixel sub-electrode may have different planar areas from each other.

According to an embodiment, within the pixel, the contact area may be adjacent to a pixel sub-electrode having the smallest planar area from among those of the first pixel sub-electrode, the second pixel sub-electrode and the third pixel sub-electrode.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
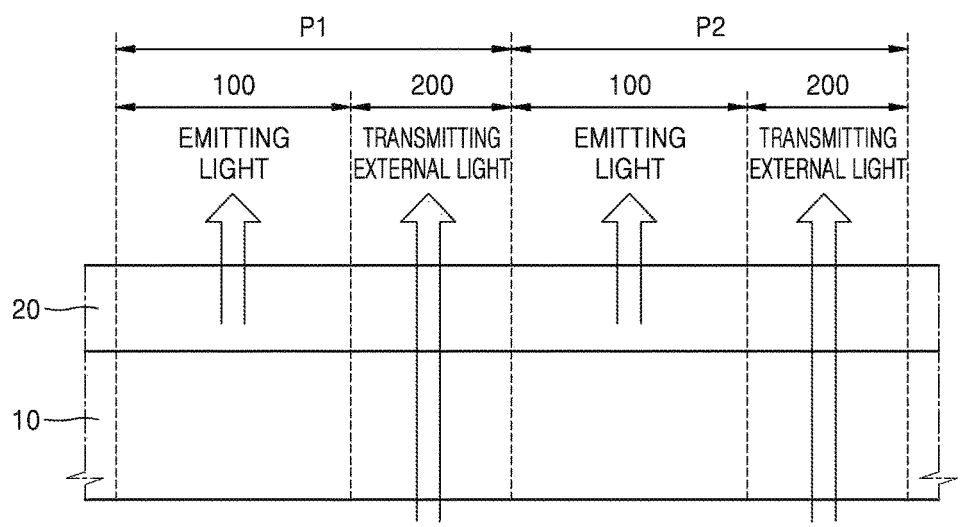
FIG. 1 is a schematic cross-sectional view of an exemplary embodiment of an organic light-emitting display apparatus according to the invention.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Therefore, the embodiments are merely described below, by referring to the figures, to explain features of the present description.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being related to another element such as being "on" another layer, region, or component, it can be directly or indirectly formed on the other layer, region, or component. That is, for example, intervening layers, regions, or components may be present. In contrast, when a layer, region, or component is referred to as being related to another element such as being "directly on" another layer, region, or component, no example, intervening layers, regions, or components are present.

It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated for convenience of explanation. In other words, since sizes and thicknesses of components in the drawings are arbitrarily illustrated for convenience of explanation, the following embodiments are not limited thereto.

An organic light-emitting display apparatus, which is a self-luminescent type display apparatus, does not require a separate light source, may be driven at a relatively low voltage, may be configured as a relatively light and thin display apparatus, and has excellent characteristics including a relatively high viewing angle and contrast, In order to increase the size of such an organic light-emitting display apparatus or to apply such organic light-emitting display apparatus to a transparent display, research into reducing or effectively preventing irregular voltage drop ("IR drop") inside a display panel is being actively conducted.

FIG. 1 is a schematic cross-sectional view of an exemplary embodiment of an organic light-emitting display apparatus according to the invention.

Referring to FIG. 1, an organic light-emitting display apparatus according to an embodiment includes a (base) substrate 10 and a display layer 20 which is on the substrate 10 and which generates and displays an image with light. Each of the substrate 10 and the display layer 20 includes (defined therefor) a plurality of pixels P1 and P2 each having a first area 100 at which light is generated and emitted to display an image and a second area 200 at which external light transmits therethrough. The external light refers to light incident from outside of the organic light-emitting display apparatus into the organic light-emitting display apparatus, such as at a surface of the substrate 10. The external light incident on a first surface of the organic light-emitting display apparatus may sequentially transmit through the substrate 10 and the display layer 20 to be recognized by a user after passing through a second surface opposite to the first surface of the organic light-emitting display apparatus. The first surface may be a lower surface of the substrate 10 while the second surface may be an upper surface of the display layer 20 at a viewing side of the organic light-emitting display apparatus.

In other words, a user on the side where an image is implemented (e.g., an upper side of the view in FIG. 1) may view an image which is disposed behind the substrate 10 (e.g., a lower side of the view in FIG. 1). Although the embodiment shown in FIG. 1 illustrates a top emission type in which an image generated by the display layer 20 is implemented in a direction away from the substrate 10, embodiments are not necessarily limited thereto. In other words, the organic light-emitting display apparatus according to another exemplary embodiment may be a bottom emission type in which an image of the display layer 20 is implemented in a direction toward the substrate 10, or a dual emission type in which an image of the display layer 20 is implemented in both the direction away from the substrate 10 and the direction toward the substrate 10.

The organic light-emitting display apparatus may be disposed in a plane parallel to a plane defined by first and second directions which cross each other. In FIG. 1, the horizontal direction may represent the first and/or the second direction. A thickness of the organic light-emitting display apparatus and elements/devices thereof, extends in a third direction which crosses each of the first and second directions. In FIG. 1, the vertical direction represents the third direction. The first, second and third directions may be orthogonal to each other, but embodiments are not necessarily limited thereto FIG. 1 illustrates that a first pixel P1 and a second pixel P2 are two adjacent pixels included in an organic light-emitting display apparatus according to an exemplary embodiment. Each of the plurality of pixels P1 and P2 includes the first area 100 and the second area 200. An image is generated at the first area 100 of the display layer 20 by emitting light, and external light is transmitted through the second area 200. FIG. 1 illustrates the first area 100 alternating with the second area 200 in a direction, e.g., left-to-right, but embodiments are not necessarily limited thereto. The second area 200 may be arranged in each of a plurality of pixels P1 and P2 to define two separate second areas 200. Alternatively, a single second area 200 may be common to both pixels P1 and P2 so as to be connected between the plurality of pixels P1 and P2. Each of the plurality of pixels P1 and P2 may respectively include a plurality of sub-pixels.

In the second area 200, a device or element of the organic light-emitting display apparatus including a non-transparent metal (material), such as a thin film transistor ("TFT"), a capacitor and an organic light-emitting device, is not disposed. Based on this configuration, external light transmittance in the second area 200 may be increased since there is no interference with the non-transparent metal.

Figure 2A:
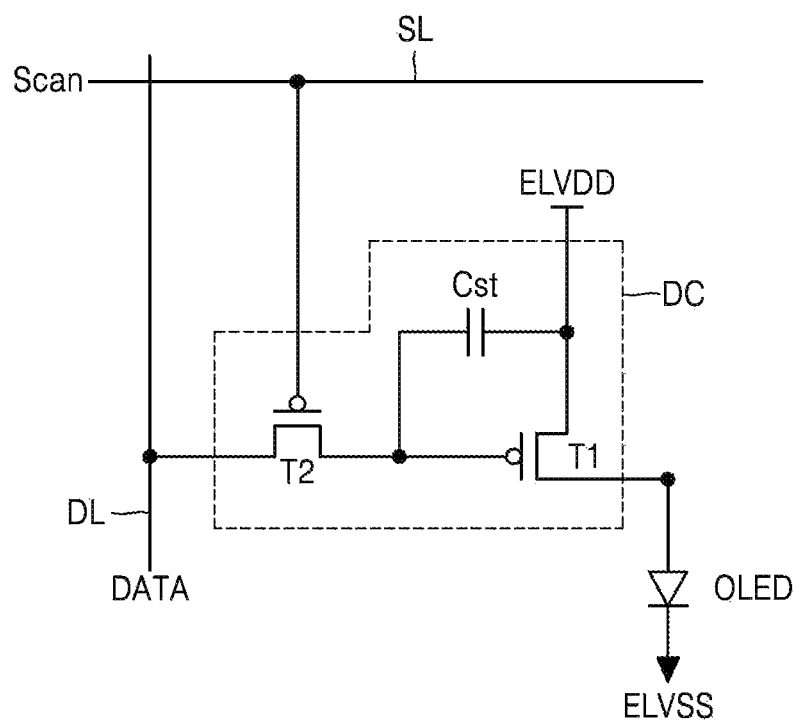
FIG. 2A is an equivalent circuit diagram of an exemplary embodiment of a sub-pixel of an organic light-emitting display apparatus according to the invention.

FIG. 2A is an equivalent circuit diagram of an exemplary embodiment of a sub-pixel of an organic light-emitting display apparatus according to the invention.

Referring to FIG. 2A, the sub-pixel includes an organic light-emitting device OLED and a pixel circuit DC which drives and/or controls the organic light-emitting device OLED. The pixel circuit DC may include at least one TFT and/or at least one capacitor. The at least one TFT and/or the at least one capacitor may be electrically connected to a plurality of conductive (signal) wires, e.g., a scan line SL, a data line DL and a driving voltage line ELVDD, that apply a scan signal Scan, a data signal DATA, and a driving voltage to the pixel circuit DC, respectively.

The pixel circuit DC includes a driving TFT T1, a switching TFT T2 and a storage capacitor Cst. The switching TFT T2 is connected to a scan line SL and a data line DL and transmits a data signal DATA, which is input to the data line DL according to a scan signal Scan input to the scan line SL, to the driving TFT T1.

The storage capacitor Cst is connected to the switching TFT T2 and a driving voltage line ELVDD and stores a voltage corresponding to a difference between a voltage received from the switching TFT T2 and a driving voltage supplied to a driving voltage line ELVDD.

The driving TFT T1 is connected to the driving voltage line ELVDD and the storage capacitor Cst and may control a driving (electrical) current flowing in the organic light-emitting device OLED from the driving voltage line ELVDD in correspondence to a voltage stored in the storage capacitor Cst. The organic light-emitting device OLED may generate and emit light having a certain brightness due to the driving current.

According to an exemplary embodiment, the driving TFT T1 and the switching TFT T2 may respectively be p-channel field effect transistors. However, embodiments are not limited thereto, and the driving TFT T1 and the switching TFT T2 may be n-channel field effect transistors.

Figure 2B:
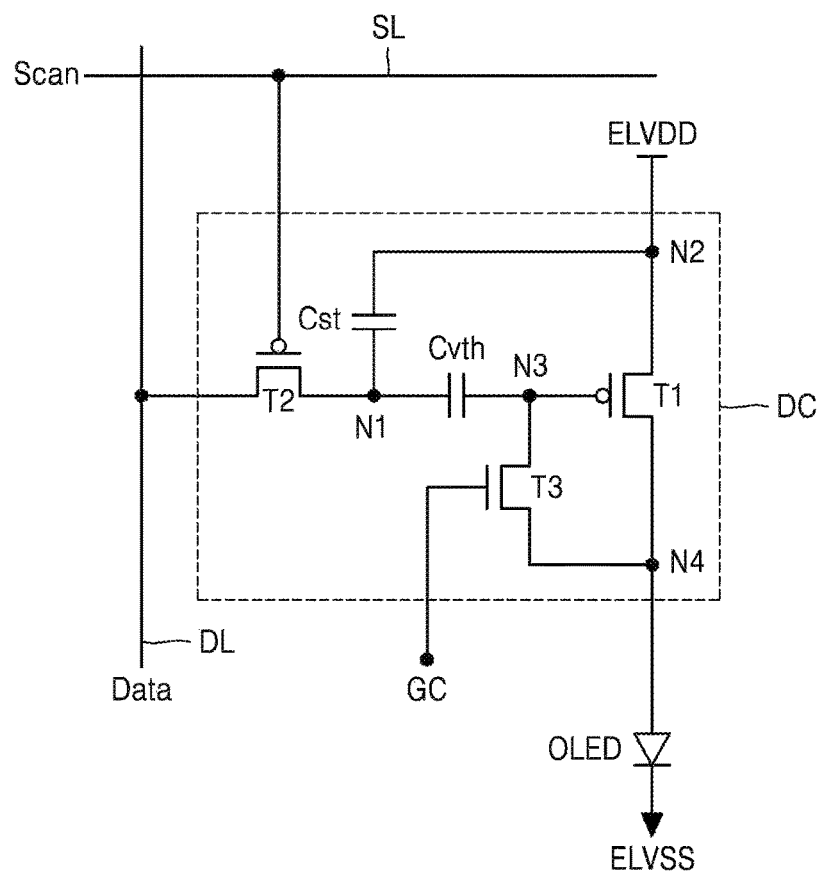
FIG. 2B is an equivalent circuit diagram of another exemplary embodiment of a sub-pixel of an organic light-emitting display apparatus according to the invention.

FIG. 2B is an equivalent circuit diagram of another exemplary embodiment of a sub-pixel of an organic light-emitting display apparatus according to the invention.

Referring to FIG. 2B, an organic light-emitting display apparatus according to an exemplary embodiment includes a plurality of pixels for respectively generating and displaying an image. Each of the plurality of pixels may include a plurality of sub-pixels. Each of the sub-pixels includes an organic light-emitting device OLED and a pixel circuit DC that drives and/or controls the organic light-emitting device OLED. The pixel circuit DC may include at least one TFT and/or at least one capacitor. The at least one TFT and/or the at least one capacitor may be electrically connected to a plurality of conductive (signal) wires, e.g., a scan line SL, a data line DL and a driving voltage line ELVDD, that apply a scan signal Scan, a data signal Data and a driving voltage to the pixel circuit DC, respectively. Although the pixel circuit DC according to an exemplary embodiment may include three TFTs T1, T2, and T3 and two capacitors Cst and Cvth, the numbers of TFTs and capacitors are not limited thereto.

The TFTs may include the driving TFT T1, the switching TFT T2 and a compensating TFT T3, and the capacitors may include the storage capacitor Cst and a compensating capacitor Cvth.

The switching TFT T2 includes a gate electrode (terminal) connected to the scan line SL, a source electrode connected to the data line DL, and a drain electrode connected to a first node N1. The switching TFT T2 is turned on by a scan signal Scan input from the scan line SL and supplies a data signal Data input to the source electrode from the data line DL, to the first node N1.

The driving TFT T1 includes a gate electrode connected to a third node N3, a source electrode connected to a driving voltage line ELVDD for supplying a driving voltage, and a drain electrode connected to a pixel electrode 130 (FIG. 4) of an organic light-emitting device OLED. The driving TFT T1 may be turned on or off by a voltage of the third node N3 and control a current supplied to the organic light emitting device OLED.

The compensating TFT T3 includes a gate electrode connected to a compensation controlling line GC for supplying a compensation control signal, a drain electrode connected to the third node N3, and a source electrode connected to the pixel electrode 130 (FIG. 4) of the organic light-emitting device OLED and the drain electrode of the driving TFT T1, that is, a fourth node N4. When the compensating TFT T3 is turned on by a compensation control signal applied to the gate electrode of the compensating TFT T3, the driving TFT T1 is diode-connected through the compensating TFT T3.

The compensating capacitor Cvth is connected between the first node N1 and the third node N3, and the storage capacitor Cst may be connected between the first node N1 and a second node N2. The storage capacitor Cst stores a voltage corresponding to a voltage difference between the first node N1 and the second node N2 and maintains the stored voltage for a certain time period. The compensating capacitor Cvth may compensate for a threshold voltage (Vth) of the driving TFT T1, together with the compensating TFT T3.

The pixel electrode 130 (FIG. 4) of the organic light-emitting device OLED is connected to the pixel circuit DC, whereas a counter electrode 150 thereof (FIG. 4) is connected to the common voltage line ELVSS. The organic light-emitting device OLED emits light having a certain brightness corresponding to a current supplied from the pixel circuit DC. According to an exemplary embodiment, the organic light-emitting device OLED may emit red light, green light, blue light or white light.

According to an exemplary embodiment, the organic light-emitting display apparatus may be a top emission type. In this case, light is emitted to outside the organic light-emitting display apparatus through the counter electrode 150 (FIG. 4), and thus the counter electrode 150 (FIG. 4) may have a relatively very small thickness. Therefore, the (electrical) resistance of the counter electrode 150 (FIG. 4) may be increased, and thus an irregular voltage drop ("IR drop") increases. As a result, common voltages respectively applied to a plurality of pixels included in the organic light-emitting display apparatus may differ from one another according to locations of the plurality of pixels therein.

The IR drop eventually causes errors in brightness values of the plurality of pixels, and thus the uniformity of an image implemented from the organic light-emitting display apparatus may be deteriorated.

Figure 4:
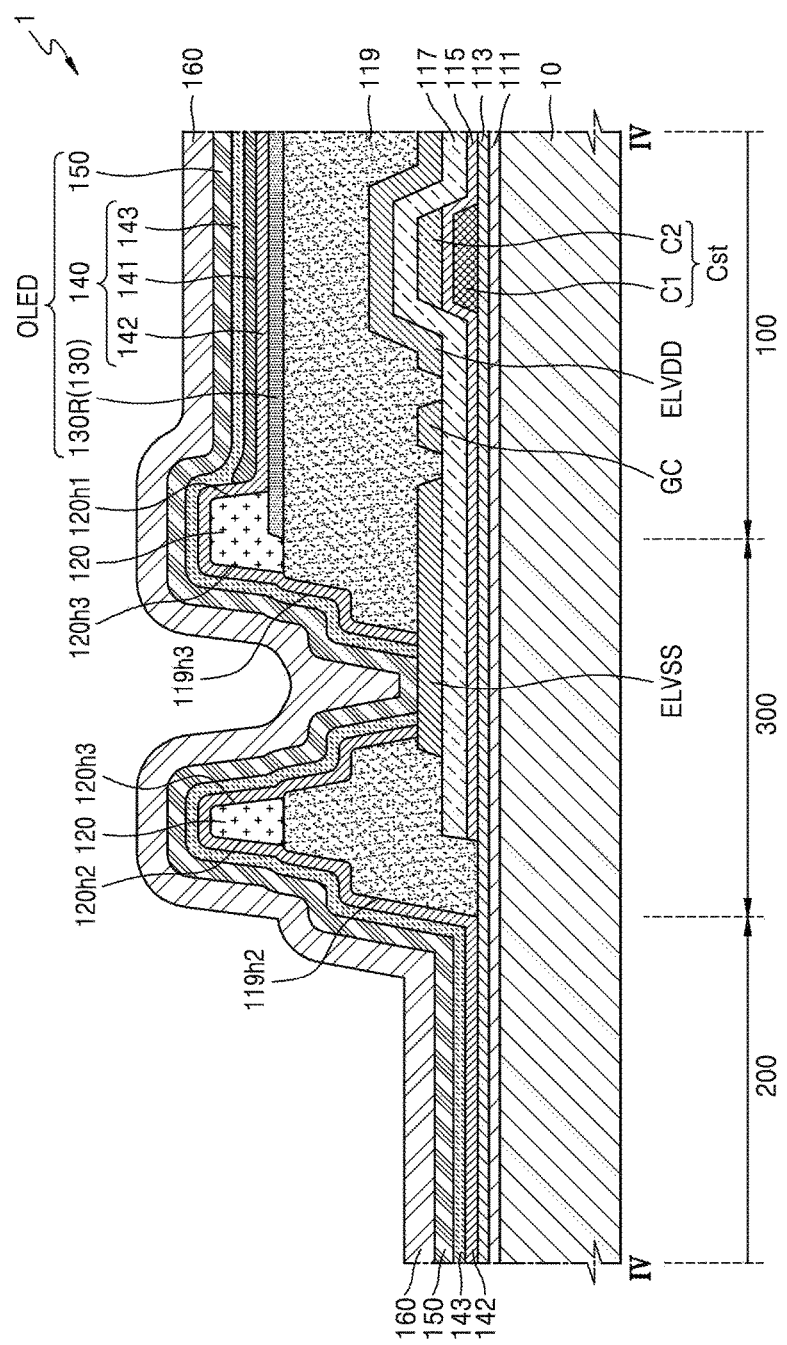
FIG. 4 is a cross-sectional view taken along line IV-IV of FIG. 3.

According to an exemplary embodiment, each of the plurality of pixels or at least some of the plurality of pixels include a contact area 300 (FIG. 4). At the contact area 300, the counter electrode 150 (FIG. 4) is connected to the common voltage line ELVSS, thereby reducing the deterioration of the uniformity of an image due to an IR drop. Detailed description thereof will be given below.

According to an exemplary embodiment, the first through third TFT T1 through T3 may respectively be p-channel field effect transistors. However, embodiments are not limited thereto. At least some of the first through third transistors T1 through T3 may be n-channel field effect transistors.

The equivalent circuit of a sub-pixel according to an exemplary embodiment is not limited to the equivalent circuit shown in FIGS. 2A and 2B, and various circuits may be applied thereto.

Figure 3:
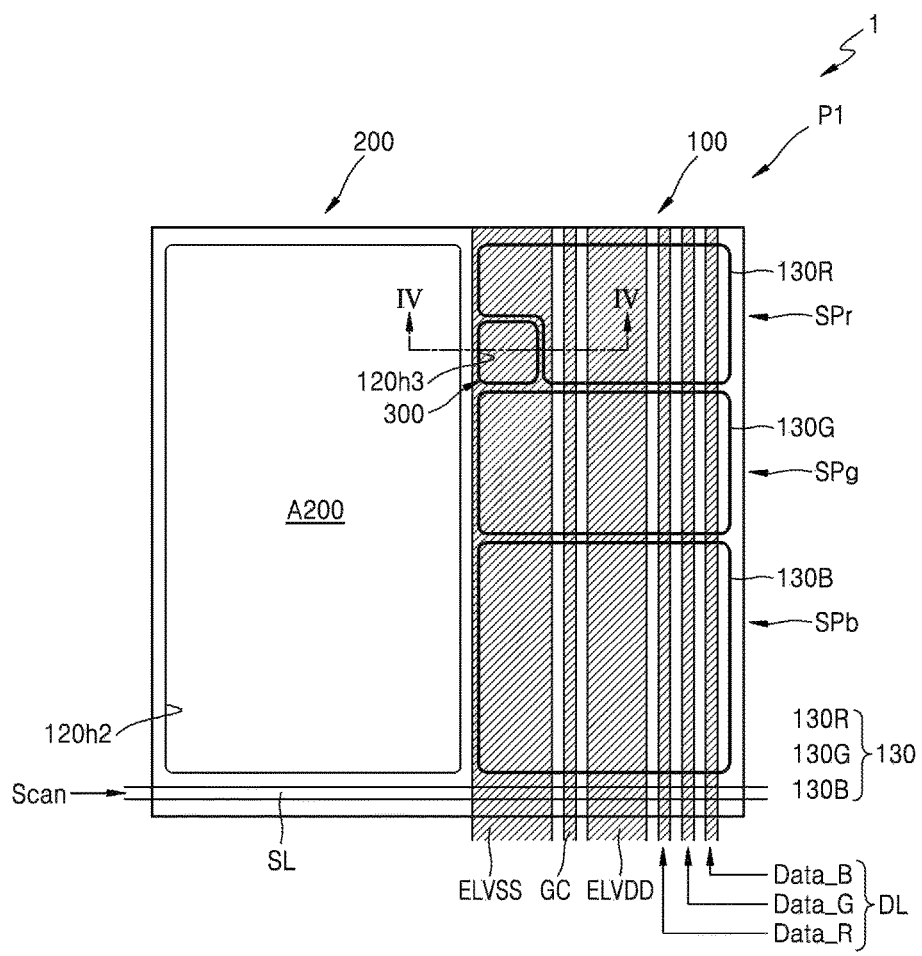
FIG. 3 is a schematic top plan view of an exemplary embodiment of a portion of a pixel included in an organic light-emitting display apparatus according to the invention.

FIG. 3 is a schematic top plan view of an exemplary embodiment of a pixel, which is included in an organic light-emitting display apparatus according to the invention, and FIG. 4 is a cross-sectional view taken along line IV-IV of FIG. 3.

Referring to FIGS. 3 and 4, an organic light-emitting display apparatus 1 according to an exemplary embodiment includes the substrate 10 and a pixel P1, which is disposed on the substrate 10. The pixel P1 includes the first area 100 at which light is generated and emitted, the second area 200 at which external light is transmitted therethrough, and a contact area 300 disposed between the pixel electrode 130 and the second area 200. Although the pixel P1 includes the contact area 300, embodiments are not limited thereto, and various modifications may be made thereto. In an alternative exemplary embodiment, for example, the contact area 300 may not be included in the pixel P1 and may be disposed outside of the pixel P1 such as between one pixel P1 and another pixel P1 adjacent thereto.

The pixel P1 includes the pixel electrode 130 disposed in the first area 100, a pixel-defining layer 120, an intermediate layer 140 including an organic emission layer 141 and the counter electrode 150. As described above, the pixel P1 may include a TFT and the capacitor Cst.

The pixel-defining layer 120 has a first opening 120h1 defined therein which exposes a portion of the pixel electrode 130 and a second opening 120h2 defined therein corresponding to at least the second area 200. The intermediate layer 140 is disposed in the first area 100, on the portion of the pixel electrode 130 exposed by the first opening 120h1. The counter electrode 150 is disposed in the first area 100, on the intermediate layer 140, and extends from the first area 100 to the contact area 300 to contact the common voltage line ELVSS in the contact area 300.

A first sub-pixel SPr, a second sub-pixel SPg and a third sub-pixel SPb, which generate and emit light of different colors, may all be disposed in the first area 100. In an exemplary embodiment, the first sub-pixel SPr, the second sub-pixel SPg and third sub-pixel SPb may emit red light, green light and blue light, respectively. However, the embodiments are not limited thereto.

The first sub-pixel SPr, the second sub-pixel SPg and the third sub-pixel SPb may all be driven by the pixel circuit DC of FIG. 2. That is, a pixel circuit DC may be common to each of the first sub-pixel SPr, the second sub-pixel SPg and the third sub-pixel SPb. According to an exemplary embodiment, at least a portion of the pixel circuit DC may 2-dimensionally overlap pixel sub-electrodes 130R, 130G and 130B included in the first sub-pixel SPr, the second sub-pixel SPg and the third sub-pixel SPb, respectively. In other words, at least a portion of the pixel circuit DC is disposed between the substrate 10 and the pixel electrode 130 in the first area 100, and no portion of the pixel circuit DC is disposed in the second area 200, and thus the aperture and the transmittance of an organic light-emitting display apparatus 1 may be improved. The pixel sub-electrodes may be provided as a discrete or island shape within ae pixel.

According to an exemplary embodiment, the first sub-pixel SPr, the second sub-pixel SPg and the third sub-pixel SPb may be arranged in a first direction (e.g., vertical in FIG. 3), and at least one conductive (signal) wire may lengthwise extend in a second direction (e.g., horizontal in FIG. 3) intersecting the first direction. The wire provided in plurality may include the scan line SL, the data line DL, the driving voltage line ELVDD and/or the common voltage line ELVSS. According to an exemplary embodiment, the wire lengthwise extending in the second direction may be, but is not limited to, the scan line SL transferring a scan signal Scan. Although not shown, a plurality of scan lines SL may be arranged and provide signals to respective sub-pixels.

According to an embodiment, the data line DL for applying data signals Data_R, Data_G, and Data_B respectively to the first sub-pixel SPr, the second sub-pixel SPg and the third sub-pixel SPb, the driving voltage line ELVDD for applying a driving voltage, the common voltage line ELVSS for applying a common voltage and the compensation controlling line GC for applying a compensation signal may each be disposed in a first area 100 and lengthwise extend in the first direction.

In other words, the data line DL, the driving voltage line ELVDD, the common voltage line ELVSS and the compensation controlling line GC may lengthwise extend in the first direction across all of the first sub-pixel SPr, the second sub-pixel SPg and the third sub-pixel SPb arranged in the first direction.

The second area 200 is a transparent area in which light incident on one surface of the substrate 10 from outside of the organic light-emitting display apparatus 1 passes through the organic light-emitting display apparatus 1 and is recognized by a user. A reflective electrode, a non-transparent device or element such as a wire or the like may not be disposed in the second area 200. The second area 200 may be defined by a non-transparent wire or a non-transparent electrode which form a boundary or edge of the second area 200. According to an exemplary embodiment, the second area 200 may be defined as an area between a non-transparent wire and another non-transparent wire spaced apart from the non-transparent wire in the first and/or second directions. Alternatively, the second area 200 may be defined as an area in which the pixel electrode 130 is not disposed and an area corresponding to a transmissive via hole 119h2 described below.

According to an exemplary embodiment, at least a portion of the common voltage line ELVSS may be disposed in the contact area 300. The common voltage line ELVSS is disposed in a same layer and may include a same material as the driving voltage line ELVDD and/or the compensation controlling line GC, among layers disposed on the substrate 10. In other words, the contact area 300 may be a non-transparent area including non-transparent devices and/or elements. The common voltage line ELVSS may be disposed inside a contact opening 120h3 in the pixel-defining layer 120.

As shown in FIG. 3, the contact area 300 may be disposed between a pixel sub-electrode 130R of the first sub-pixel SPr and the second area 200. However, embodiments are not limited thereto, and various modifications may be made thereto. In an alternative exemplary embodiment, for example, the contact area 300 may be disposed between a pixel sub-electrode 130G of the second sub-pixel SPg or between a pixel sub-electrode 130B of the third sub-pixel SPb and the second area 200.

In the first area 100 and the contact area 300, a via insulating layer 119 is disposed below the pixel-defining layer 120 to be closer to the substrate 10 than the pixel-defining layer 120. The via insulating layer 119 may have a contact via hole 119h3 defined therein which exposes the common voltage line ELVSS in the contact area 300. The center of the contact via hole 119h3 of the via insulating layer 119 may not coincide with the center of the contact opening 120h3 in the pixel-defining layer 120, such that centers of the contact via hole 119h3 and the contact opening 120h3 are offset from each other.

In the contact area 300, the common voltage line ELVSS may be exposed by the contact via hole 119h3 together with the contact opening 120h3. The common voltage line ELVSS may directly contact the counter electrode 150 at the combined contact hole including the contact via hole 119h3 together with the contact opening 120h3. Detailed description thereof will be given below.

A planar area A200 of the second area 200 may be defined at the second opening 120h2. The total planar area A200 may be a product of distances occupied by the second area 200 in first and second directions. The ratio of the total planar area A200 of the second area 200 to a total planar area of the one pixel P1 including each of the first area 100, the second area 200 and the contact area 300, may be from about 40% to about 90%. When the area A200 of the second area 200 is less than about 40% of the area of the one pixel P1, the ratio of an area having high external light transmittance of the organic light-emitting display apparatus 1 decreases, and thus the organic light-emitting display apparatus 1 functioning as a transparent display apparatus may be difficult. As the area A200 of the second area 200 increases, the transmittance of the organic light-emitting display apparatus 1 may increase. However, since the first area 100 emitting light is a minimal size within the organic light-emitting display apparatus 1, the second area 200 may not occupy more than about 90% of the total area of the one pixel P1.

A total planar area of the contact area 300 may be a product of distances occupied by the contact area 300 in first and second directions. According to an exemplary embodiment, the ratio of the total planar area of the contact area 300 to a total planar area occupied by the pixel electrode 130 may be less than about 0.5%. Since the contact area 300 is an area where the common voltage line ELVSS and the counter electrode 150 contact each other and where an image is not displayed, when the total planar area of the contact area 300 is greater than about 0.5% of the total planar area occupied by the pixel electrode 130, the aperture of the organic light-emitting display apparatus 1, at which the image is displayed and/or at which light is emitted, may be reduced.

According to an embodiment, the first pixel sub-electrode 130R, the second pixel sub-electrode 130G and the third pixel sub-electrode 130B respectively disposed at the first sub-pixel SPr, the second sub-pixel SPg and the third sub-pixel SPb may have different planar areas from each other. The contact area 300 may be disposed in an area adjacent to the first sub-pixel SPr of the first area 100. According to an exemplary embodiment, to secure the contact area 300, the area of the first pixel sub-electrode 130R may be less than that of the second pixel sub-electrode 130G. The planar areas and total planar areas of the various electrodes and areas discussed above, may be maximum planar areas thereof.

Hereinafter, with reference to FIG. 4, a cross-sectional structure taken along line IV-IV of FIG. 3 will be described.

Referring to FIG. 4, a buffer layer 111 may be disposed on the substrate 10. The substrate 10 may include glass or plastic, whereas the buffer layer 111 may include a single film or a multilayered film including an inorganic material, such as silicon nitride ($SiN_x$) and/or silicon oxide ($SiO_2$). The buffer layer 111 may block permeation of impurity elements incident through the substrate 10 to other layers on the substrate 10, and planarize a surface of the substrate 10. The pixel circuit DC (FIG. 2B) including the at least one TFT T1, T2, and T3 (FIG. 2B) and the at least one capacitor Cst, the data line DL (FIG. 2) for applying data signals DATA_R, DATA_G, and DATA_B to the pixel circuit DC, the driving voltage line ELVDD, the compensation controlling line GC, and the common voltage line ELVSS may be arranged over the buffer layer 111 in the first area 100.

For convenience of explanation, FIG. 4 shows only the storage capacitor Cst from among elements included in the pixel circuit DC (FIG. 2B). The storage capacitor Cst may include a lower electrode C1 disposed over a first insulation layer 113 and an upper electrode C2 which faces the lower electrode C1 with a second insulation layer 115 therebetween.

The lower electrode C1 and the upper electrode C2 may include a single film or a multilayered film including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu). According to an exemplary embodiment, each of the lower electrode C1 and the upper electrode C2 may be a single film including molybdenum (Mo) or a triple film including Mo/Al/Mo. A third insulation layer 117 may be disposed on the upper electrode C2.

Each of the first insulation layer 113, the second insulation layer 115 and the third insulation layer 117 may be a single film or a double film including an inorganic material, such as silicon nitride ($SiN_x$) and/or silicon oxide ($SiO_2$). At least one of the first insulation layer 113, the second insulation layer 115 and the third insulation layer 117 may have an opening defined therein corresponding to the second area 200.

The driving voltage line ELVDD, the compensation controlling line GC and the common voltage line ELVSS may be disposed on the third insulation layer 117. In other words, the driving voltage line ELVDD, the compensation controlling line GC and the common voltage line ELVSS may be disposed in a same layer among layers disposed on the substrate 10 and may include a same material. Each of the driving voltage line ELVDD, the compensation controlling line GC and the common voltage line ELVSS may be a single film or a multilayered film including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu). According to an exemplary embodiment, the driving voltage line ELVDD, the compensation controlling line GC, and the common voltage line ELVSS may include a triple film including Mo/Al/Mo or Ti/Al/Ti.

The via insulating layer 119 covering the driving voltage line ELVDD, the compensation controlling line GC and the common voltage line ELVSS may be disposed on the third insulation layer 117. The via insulating layer 119 may include an organic material to planarize a step due to devices and elements of the pixel circuit DC (FIG. 2).

The via insulating layer 119 may include at least the transmissive via hole 119$h$2 corresponding to the second area 200, thereby improving the transmittance of light at the second area 200. According to an exemplary embodiment, the side surface of the via insulating layer 119 at the transmissive via hole 119$h$2 may have a stepped shape. The stepped shape may define a relatively gentle slope of the side surface at the transmissive via hole 119$h$2 with respect to the top surface of the substrate 10. As the counter electrode 150 disposed on the side surface of the via insulating layer 119 at the transmissive via hole 119$h$2 extends along the gentle slope of the transmissive via hole 119$h$2, the possibility that the counter electrode 150 is disconnected inside the transmissive via hole 119$h$2 may be significantly reduced.

The organic light-emitting device OLED including the pixel sub-electrode 130R, the counter electrode 150 facing the pixel sub-electrode 130R, and the intermediate layer 140 between the pixel sub-electrode 130R and the counter electrode 150 and including the organic emission layer 141, may be disposed in the first area 100 over the via insulating layer 119. Although not shown, the pixel sub-electrode 130R may be electrically connected to the pixel circuit DC (FIG. 2) at an opening in the via insulating layer 119.

The pixel sub-electrode 130R has two edges opposite to each other, such as in the first and/or second directions. The two opposite edges of the pixel sub-electrode 130R are covered by the pixel-defining layer 120. The pixel-defining layer 120 may include the first opening 120$h$1 exposing a portion of the pixel sub-electrode 130R, the second opening 120$h$2 corresponding to the second area 200, and the contact opening 120$h$3 corresponding to the contact area 300. Although FIG. 4 shows that the second opening 120$h$2 and the contact opening 120$h$3 are separately provided in respective correspondence to the second area 200 and the contact area 300, embodiments are not limited thereto, and various modifications may be made thereto. In an exemplary embodiment, for example, the pixel-defining layer 120 may have one single opening corresponding to both the second area 200 and the contact area 300, to be commonly disposed in the second area 200 and the contact area 300. According to some embodiments, the second opening 120h2 may be formed in correspondence to a total distance or area occupied by the second area 200 and the contact area 300. In this case, the pixel-defining layer 120 may not be disposed on the via insulating layer 119 of the contact area 300.

The pixel sub-electrode 130R is a reflective electrode and may include at least one reflective layer including a material selected from among Ag, Mg, Al, Pt, Pd, Au, Ni, Nd, Ir, Cr, and combinations thereof. According to an exemplary embodiment, the pixel sub-electrode 130R may further include a transparent or semi-transparent electrode layer disposed on top and/or below the reflective layer. According to an exemplary embodiment, the pixel sub-electrode 130R may include indium tin oxide/silver/indium tin oxide (ITO/Ag/ITO).

The common voltage line ELVSS may be disposed in the contact area 300. The common voltage line ELVSS may be disposed in a same layer and may include a same material as the driving voltage line ELVDD and/or the compensation controlling line GC, among layers disposed on the substrate 10. The first area 100 may be defined as an area in which the pixel sub-electrode 130R is disposed, and the contact area 300 may be defined as an area in which the common voltage line ELVSS and the counter electrode 150 contact each other inside the contact via hole 119h3 in the via insulating layer 119. A boundary of the first area 100 may be defined at an edge of the pixel sub-electrode 130R, but embodiments are not limited thereto.

The common voltage line ELVSS may widthwise extend from the first area 100 to the contact area 300 to dispose portions thereof in each of the first area 100 and the contact area 300. The via insulating layer 119 may include the contact via hole 119h3 defined therein exposing the common voltage line ELVSS in the contact area 300. Therefore, the via insulating layer 119 may expose a portion of the common voltage line ELVSS in the contact area 300.

According to an exemplary embodiment, the side surface of the via insulating layer 119 at the contact via hole 119h3 may have a stepped shape. The stepped shape may define a relatively gentle slope of the side surface at the contact via hole 119h3 with respect to the top surface of the substrate 10. As the counter electrode 150 disposed on the side surface of the via insulating layer 119 at the contact via hole 119h3 extends along the gentle slope of the contact via hole 119h3, the possibility that the counter electrode 150 is disconnected inside the contact via hole 119h3 may be significantly reduced.

The via insulating layer 119 including the transmissive via hole 119h2 and the contact via hole 119h3 defined therein may be disposed using various methods. In an exemplary embodiment of manufacturing a display apparatus, for example, a photoresist material may be used to dispose a preliminary via insulating layer, and exposures for portions of the preliminary via insulating layer where the transmissive via hole 119h2 and the contact via hole 119h3 of the via insulating layer 119 are to be formed may be differentiated by using a slit mask or a half-tone mask while the top surface of the preliminary via insulating layer is substantially flat during a manufacturing process, such that particular portions of the preliminary via insulating layer are etched (removed) relatively more than the remaining portion to form the via insulating layer 110. Therefore, as the transmissive via hole 119h2 and the contact via hole 119h3 are formed, steps may be formed on the side surfaces thereof at such holes.

Furthermore, by making an organic material constituting the via insulating layer 119 flowable downward toward the substrate 10 via an additional thermal reflowing operation, angles of inclinations of edge portions of the inner side surfaces of the via insulating layer 119 at the transmissive via hole 119h2 and the contact via hole 119h3 may be controlled.

The intermediate layer 140 including the organic emission layer 141 may be disposed on the portion of the pixel sub-electrode 130R exposed by the first opening 120h1. The intermediate layer 140 may include a first common layer 142 disposed between the pixel sub-electrode 130R and the organic emission layer 141 and a second common layer 143 disposed between the organic emission layer 141 and the counter electrode 150. The first common layer 142 and the second common layer 143 may be arranged in common with respect to all pixels.

The first common layer 142 may include a hole injection layer ("HIL") and/or a hole transport layer ("HTL"), and the second common layer 143 may include an electron transport layer ("ETU") and/or an electron injection layer ("EIL"). In an exemplary embodiment, the organic emission layer 141 emits light as excitons, which are generated when hole particles injected from the HIL combine with electron particles injected from the EIL in the organic emission layer 141, transition from an excited state to a ground state.

Each of the first common layer 142, the second common layer 143 and the counter electrode 150 may be disposed in the first area 100 and the second area 200. The first common layer 142, the second common layer 143 and the counter electrode 150 may be disposed in common with respect to all pixels included in the organic light-emitting display apparatus 1. According to an exemplary embodiment, the first common layer 142, the second common layer 143 and the counter electrode 150 may be disposed throughout the entire area of the organic light-emitting display apparatus 1. The light transmittance of the first common layer 142, the second common layer 143 and the counter electrode 150 may be adjusted to about 50% or higher. According to another exemplary embodiment, since the first common layer 142, the second common layer 143 and the counter electrode 150 may be disposed throughout the entire area of the organic light-emitting display apparatus 1, at least one of the first common layer 142, the second common layer 143 and the counter electrode 150 may have an opening defined therein corresponding to the second area 200.

According to an exemplary embodiment, the first common layer 142 and the second common layer 143 may not be disposed in at least a portion of the contact area 300. Since the contact area 300 is an area in which the counter electrode 150 contacts with the common voltage line ELVSS to reduce an IR drop, the first common layer 142 and the second common layer 143 may not be disposed in at least a portion of the contact area 300. In an exemplary embodiment of manufacturing a display apparatus, a portion of a preliminary material layer for forming the first common layer 142 and the second common layer 143 at the common voltage line ELVSS may be removed such as by using a laser or the like, to expose the common voltage line ELVSS.

In an exemplary embodiment of manufacturing a display apparatus, after at the portion if the preliminary material layers of the first common layer 142 and the second common layer 143 corresponding to the contact area 300 are removed to expose the common voltage line ELVSS, the counter electrode 150 is disposed, thereby brining the common voltage line ELVSS in contact with the counter electrode 150. In other words, the first common layer 142 and the second common layer 143 may be disposed throughout an entirety of the pixel P1 except in at least a portion of the contact area 300.

Although FIG. 4 shows that the organic emission layer 141 is disposed only over the pixel sub-electrode 130R, embodiments are not limited thereto. The organic emission layer 141 may also be disposed on at least a portion of the contact area 300, e.g., the sidewall(s) of the pixel-defining layer 120 at the third opening 120h3 and/or the via insulating layer 119 at the contact via hole 119h3. In this case, in an exemplary embodiment of manufacturing a display apparatus, a preliminary material layer for forming the organic emission layer 141 may be deposited in the contact area 300 like those for the first common layer 142 and the second common layer 143, and at least a portion of the preliminary material layer for the organic emission layer 141 corresponding to the contact area 300 is removed such as by laser or the like.

In a conventional method of manufacturing a display apparatus, when silver (Ag) is included in the common voltage line ELVSS and a laser beam is irradiated thereto to remove the first common layer 142 and the second common layer 143 disposed on the common voltage line ELVSS, some Ag particles may escape and collect on the via insulating layer 119, and thus defects may be caused in subsequent operations.

Therefore, in one or more embodiment of the invention, the common voltage line ELVSS may include a material that is less damaged during a laser irradiation. According to some embodiments, the common voltage line ELVSS may not include silver (Ag). In an exemplary embodiment, for example, the common voltage line ELVSS may be a single film or a multilayered film including aluminum (Al), molybdenum (Mo), and titanium (Ti) or a triple layer including Mo/Al/Mo or Ti/Al/Ti.

In a conventional method of manufacturing a display apparatus, a method of bringing the common voltage line ELVSS in contact with the counter electrode 150 in the contact area 300 by using a contact conductive layer that is disposed in a same layer and includes a same material as the pixel sub-electrode 130R may be used. However, since the pixel sub-electrode 130R may include Ag that causes the pixel sub-electrode 130R to function as a reflective layer, the contact conductive layer may also include Ag. In this case, Ag particles may escape during a laser irradiation and cause defects in subsequent operations.

According to embodiments, since the common voltage line ELVSS directly contacts the counter electrode 150 without using a contact conductive layer including a same material as the pixel sub-electrode 130R, the defects as described above may be minimized.

The counter electrode 150 may include a transparent or semitransparent electrode, may include one or more materials selected from among Ag, Al, Mg, Li, Ca, Cu, LiF/Ca, LiF/Al, MgAg, and CaAg, and may be disposed as a relatively thin film having a thickness from several to several dozens of nanometers. According to some embodiments, the counter electrode 150 may have a thickness from about 10 nanometers (nm) to about 15 nm. The counter electrode 150 may be disposed to be commonly electrically connected to all pixels included in the organic light-emitting display apparatus 1. The thickness of elements or components within the display apparatus 1 may represent maximum thicknesses of such elements or components.

In an exemplary embodiment of manufacturing a display apparatus, after the counter electrode 150 is formed, an operation for improving contacting characteristics between the counter electrode 150 and the common voltage line ELVSS may be additionally performed, such as by irradiating a laser beam onto the counter electrode 150 in the contact area 300. In this case, since the counter electrode 150 and the common voltage line ELVSS directly contact each other, the contact characteristics thereof may be improved even with a relatively weak laser beam. However, in exemplary embodiments, such a laser irradiating operation may be omitted.

A protection layer 160 may be further disposed on the counter electrode 150. The protection layer 160 may cover and protect the organic light-emitting device OLED. The protection layer 160 may employ an inorganic (material) insulation film and/or an organic (material) insulation film. The inorganic insulation film may include $SiO_2$, $SiN_x$, SiON, $Al_2O_3$, $TiO_2$, $Ta_2O_5$, $HfO_2$, $ZrO_2$, BST, PZT, etc. The organic insulation film may include a common general-purpose polymer (polymethyl methacrylate ("PMMA") or polystyrene ("PS")), a polymer derivative including a phenol group, an acrylic polymer, an imide polymer, an aryl ether polymer, an amide polymer, a fluorine polymer, a p-xylene polymer, a vinyl alcohol polymer, and combinations thereof. In an exemplary embodiment of manufacturing a display apparatus, the protection layer 160 may be deposited using various deposition methods, such as plasma enhanced chemical vapor deposition ("PECVD"), atmospheric pressure chemical vapor deposition ("APCVD") or low pressure chemical vapor deposition ("LPCVD"). A collection of the layers on the substrate 10, from 111 to 160, may correspond to the display layer 20 in FIG. 1.

Furthermore, although not shown, a functional layer, such as a capping layer (not shown) for improving optical efficiency by adjusting the overall optical thickness of the organic light-emitting device OLED may be further disposed over the counter electrode 150. A collection of the layers on the substrate 10, from 111 to 160 and including the capping layer, may correspond to the display layer 20 in FIG. 1.

According to an exemplary embodiment, the organic light-emitting display apparatus 1 may be sealed with a sealing substrate (not shown) or a thin-film encapsulating layer (not shown). The sealing substrate or the thin-film encapsulating layer may for an outer surface of the display apparatus 1. The sealing substrate or the thin-film encapsulating layer serves to shield the display layer 20 (FIG. 1) including the organic light-emitting device OLED from external moisture or the air. The sealing substrate may include various plastic substrates, such as an acrylic substrate, as well as a glass substrate, or may even include a metal plate. The thin-film encapsulating layer may include at least one organic layer and at least one inorganic layer. A polarizing layer or a color converting layer may be further included on the sealing substrate or the thin-film encapsulating layer in some cases. A collection of the layers on the substrate 10, from 111 through the sealing substrate or the thin-film encapsulating layer, even including the polarizing layer or a color converting layer, may correspond to the display layer 20 in FIG. 1.

When sealed with a sealing substrate as an outer layer of the display apparatus 1, a filler (not shown) may be further disposed between the counter electrode 150 and the sealing substrate to protect the display layer 20 (FIG. 1) from external shocks. The filler may include an insulating material. According to some embodiments, the filler may include an organic sealant, such as a urethane-based resin, an epoxy-based resin, and an acryl-based resin, or silicon, which is an inorganic sealant. As the urethane-based resin, urethane acrylate or the like may be used, for example. As the acryl-based resin, butyl acrylate, ethylhexyl acrylate, or the like may be used, for example. According to some embodiments, the filler may be polyimide.

Figure 5:
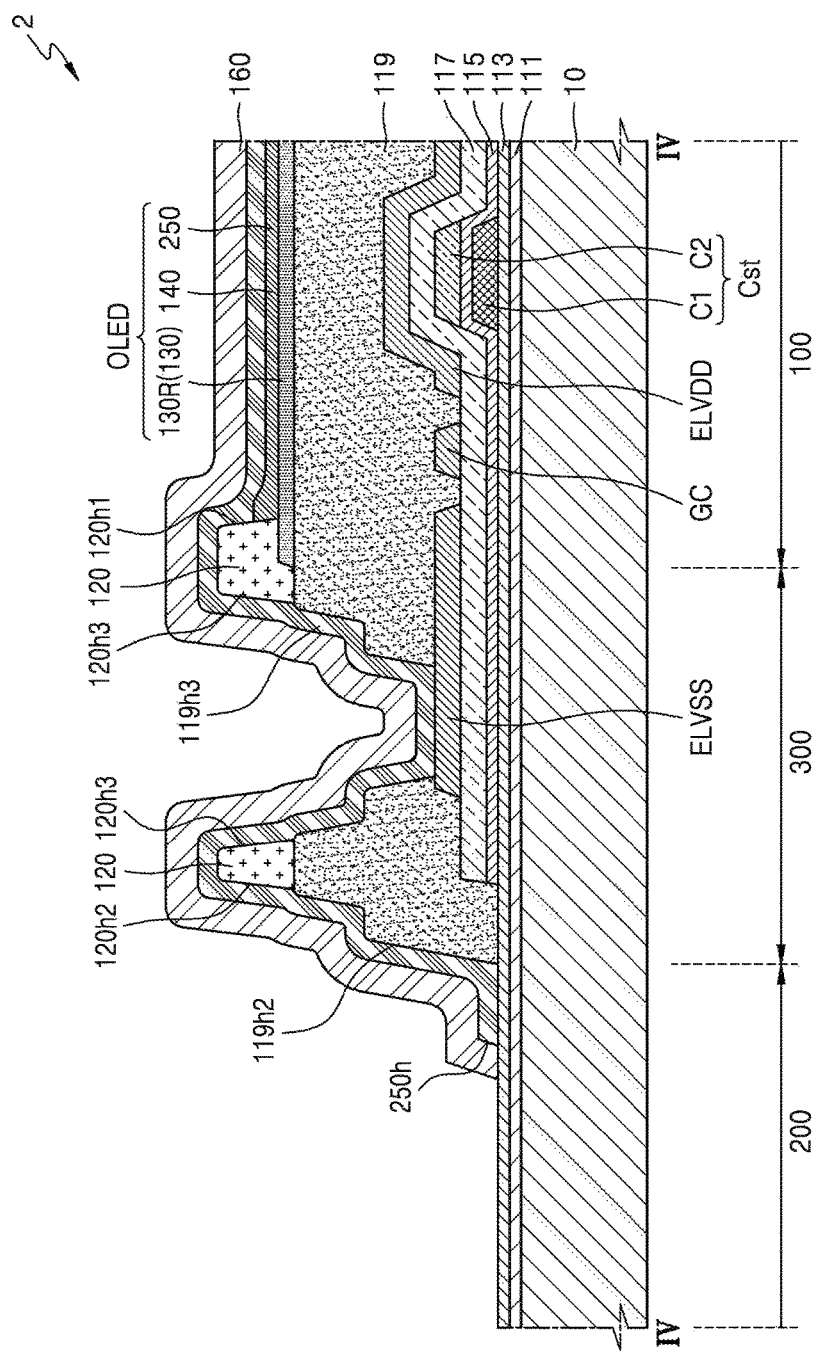
FIG. 5 is a schematic cross-sectional view of a modified exemplary embodiment of a portion of a pixel included in an organic light-emitting display apparatus according to the invention.

FIG. 5 is a schematic cross-sectional view of a modified exemplary embodiment of a portion of a pixel included in an organic light-emitting display apparatus according to the invention. In FIG. 5, the same reference numerals as those in FIG. 4 denote the same members, and repeating descriptions thereof will be omitted for simplicity of explanation. FIG. 5 is a cross-sectional view similar to that of FIG. 4, taken along line IV-IV of FIG. 3.

Referring to FIG. 5, an organic light-emitting display apparatus 2 according to an exemplary embodiment includes the substrate 10 and the pixel P1. The pixel P1 is disposed on the substrate 10 and includes the first area 100 emitting light, the second area 200 transmitting external light, and the contact area 300 disposed between the first area 100 and the second area 200. Although it is described in the present embodiment that the pixel P1 includes the contact area 300, embodiments are not limited thereto, and various modifications may be made thereto. In an exemplary embodiment, for example, the contact area 300 may not be included in the pixel P1 and may be disposed outside of the pixel P1 such as between one pixel P1 and another pixel adjacent to the one pixel P1.

The pixel P1 includes the pixel electrode 130 disposed in the first area 100, the pixel-defining layer 120 including the first opening 120h1 defined therein disposed at least in the first area 100 and exposing a portion of the pixel electrode 130, the second opening 120h2 defined therein corresponding to at least the second area 200, and the contact opening 120h3 defined therein corresponding to at least the contact area 300, the intermediate layer 140 disposed on the portion of the pixel electrode 130 exposed by the first opening 120h1 and including the organic emission layer 141, and a counter electrode 250 disposed on the intermediate layer 140 and contacting the common voltage line ELVSS in the contact area 300.

In the contact area 300, the common voltage line ELVSS is exposed by the contact via hole 119h3 of the via insulating layer 119, and the common voltage line ELVSS may directly contact the counter electrode 250. According to an exemplary embodiment, the inner side surface of the via insulating layer 119 at the contact via hole 119h3 may have a stepped shape. Therefore, the slope of the via insulating layer 119 at the contact via hole 119h3 may be relatively gentle with respect to the top surface of the substrate 10, thereby minimizing disconnection of the counter electrode 250 formed thereon.

The other structure of the organic light-emitting display apparatus 2 according to the embodiment of FIG. 5 is identical to that of the organic light-emitting display apparatus 1 of FIG. 4, only except for the configuration of the counter electrode 250.

The counter electrode 250 included in the organic light-emitting display apparatus 2 according to an exemplary embodiment may have an opening 250h defined therein corresponding to the second area 200. Since a material layer of the counter electrode 250 is omitted in the second area 200, the above-stated configuration may further improve the transmittance of the organic light-emitting display apparatus 2.

Although FIG. 5 does not show components corresponding to the first common layer 142 and the second common layer 143 of FIG. 4, at least one of the first common layer 142 and the second common layer 143 may be further included in the intermediate layer 140 as shown in FIG. 4, if necessary. Although an organic light-emitting display apparatus including the second area 200 for transmitting external light therethrough has been described, embodiments are not limited thereto. Embodiments may also be applied to cases where the second area 200 is not disposed, as shown in FIGS. 6 and 7 to be described below.

Figure 6:
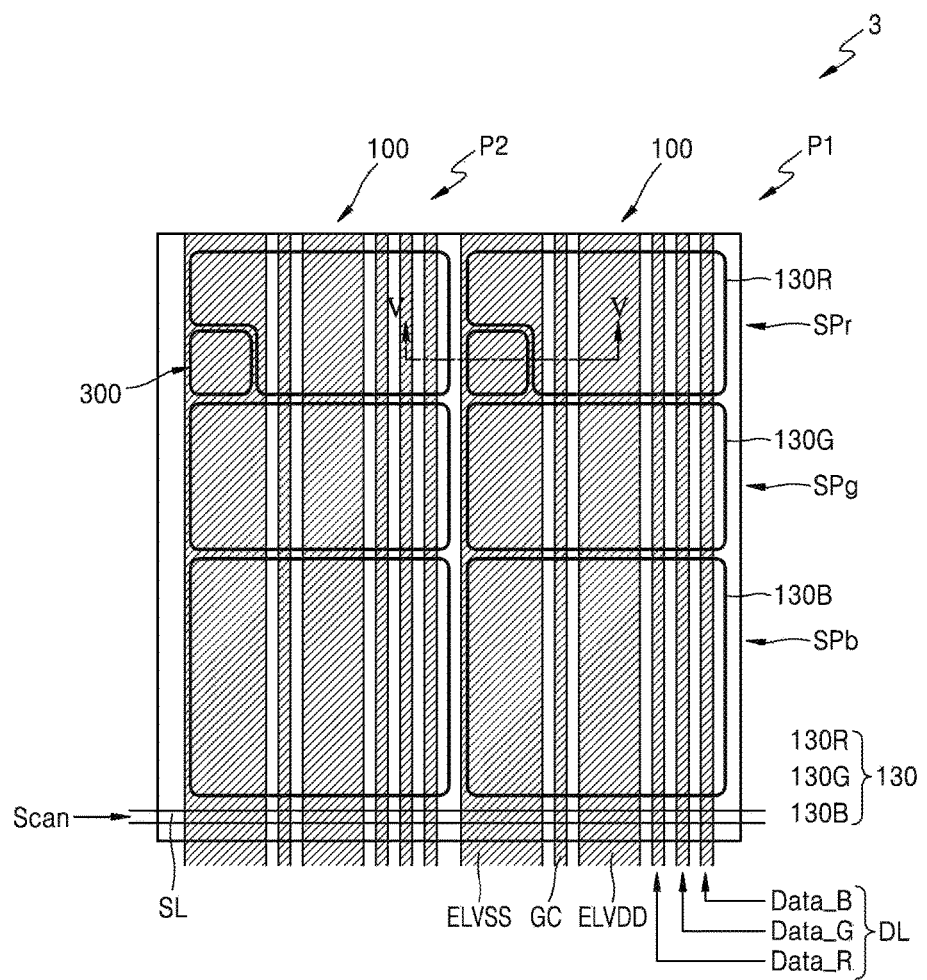
FIG. 6 is a schematic top plan view of an exemplary embodiment of two adjacent pixels included in an organic light-emitting display apparatus according to the invention.
Figure 7:
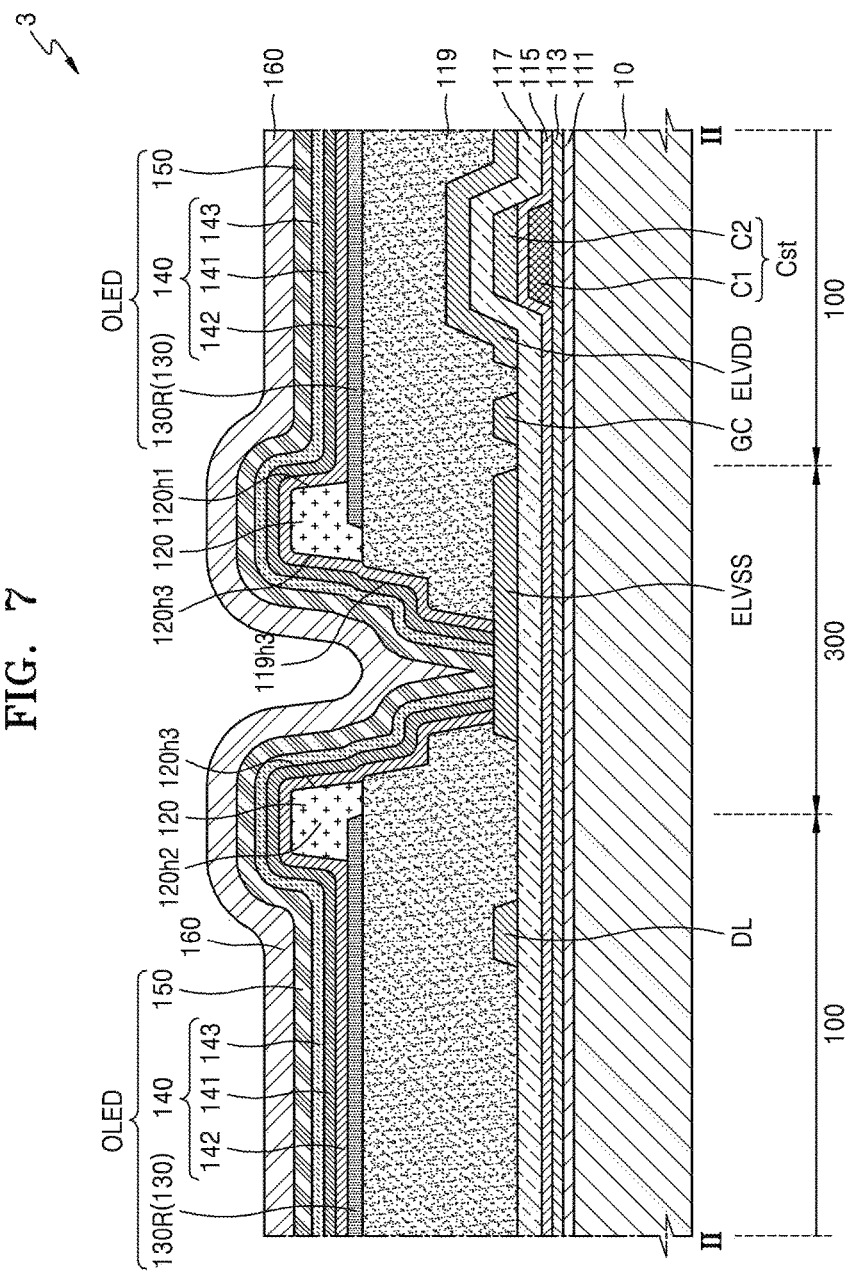
FIG. 7 is a cross-sectional view taken along line V-V of FIG. 6.

FIG. 6 is a schematic top plan view of an exemplary embodiment of two adjacent pixels included in an organic light-emitting display apparatus according to the invention, and FIG. 7 is a cross-sectional view taken along line V-V of FIG. 6. In FIGS. 6 and 7, the same reference numerals as those in FIGS. 3 and 4 denote the same members, and repeating descriptions thereof will be omitted for simplicity of explanation.

Referring to FIGS. 6 and 7, the organic light-emitting display apparatus 3 according to an exemplary embodiment includes the substrate 10 and a pixel P1, which is disposed on the substrate 10 and includes the first area 100 emitting light and the contact area 300 disposed on a side of first area 100. Although it is described in the present embodiment that the pixel P1 includes the contact area 300, embodiments are not limited thereto. In an exemplary embodiment, for example, the contact area 300 may not be included in the pixel P1 and may be disposed outside the pixel P1 to be between the pixel P1 and another pixel P2 adjacent to the pixel P1.

The pixel P1 includes the pixel electrode 130 disposed in the first area 100, the pixel-defining layer 120 including the first opening 120h1 defined therein disposed at least in the first area 100 and exposing a portion of the pixel electrode 130 and the contact opening 120h3 defined therein corresponding to at least the contact area 300, the intermediate layer 140 disposed on the portion of the pixel electrode 130 exposed by the first opening 120h1 and including the organic emission layer 141, and the counter electrode 150 disposed on the intermediate layer 140 and contacting the common voltage line ELVSS in the contact area 300.

According to an exemplary embodiment, the organic light-emitting display apparatus 3 includes the other pixel P2 adjacent to the pixel P1. For convenience of explanation, the pixel P1 and the other pixel P2 will be referred to as a first pixel P1 and a second pixel P2, respectively.

Each of the first pixel P1 and the second pixel P2 include the first sub-pixel SPr, the second sub-pixel SPg and the third sub-pixel SPb, which emit light of different colors. The first pixel sub-electrode 130R, the second pixel sub-electrode 130G and the third pixel sub-electrode 130B may be disposed in the first sub-pixel SPr, the second sub-pixel SPg and the third sub-pixel SPb, respectively.

Each of the first pixel P1 and the second pixel P2 do not include the second region 200 (FIG. 3) through which external light is transmitted, and the sub-pixels SPr, Spg and Spb of the first pixel P1 may be arranged adjacent to the sub-pixels SPr, Spg and Spb of the second pixel P2 with no second region 200 therebetween.

Each of the first pixel P1 and the second pixel P2 may include the contact area 300 in which the counter electrode 150 and the common voltage line ELVSS directly contact each other. However, embodiments are not limited thereto, and various modifications may be made thereto. In an exemplary embodiment, for example, the contact area 300 may be included only in the first pixel P1 or only in the second pixel P2 among the two adjacent pixels P1 and P2. Furthermore, although FIGS. 6 and 7 show that the contact area 300 is disposed adjacent to the first sub-pixel SPr, embodiments are not limited thereto, and various modifications may be made thereto. In an exemplary embodiment, for example, the contact area 300 may be disposed adjacent to the second sub-pixel SPg or the third sub-pixel Spb. Furthermore, two or more contact areas 300 may be arranged in one pixel.

As shown in FIG. 7, the common voltage line ELVSS may be disposed in the contact area 300, and the common voltage line ELVSS may be disposed in a same layer and may include a same material as the driving voltage line ELVDD and/or the compensation controlling line GC among layers disposed on the substrate 10. The first area 100 may be defined as an area in which the pixel sub-electrode 130R is disposed, and the contact area 300 may be defined as an area in which the common voltage line ELVSS and the counter electrode 150 contact each other inside the contact opening 120h3 in the pixel-defining layer 120. A boundary of the first area 100 may be defined at an edge of the pixel sub-electrode 130R, but embodiments are not limited thereto.

The common voltage line ELVSS may widthwise extend from the first area 100 to the contact area 300 to dispose portions thereof in each of the first area 100 and the contact area 300 The via insulating layer 119 may include the contact via hole 119h3 defined therein exposing the common voltage line ELVSS in the contact area 300. Therefore, the via insulating layer 119 may expose a portion of the common voltage line ELVSS in the contact area 300.

According to an exemplary embodiment, the side surface of the via insulating layer 119 at the contact via hole 119h3 may have a stepped shape. The stepped shape may define a relatively gentle slope of the side surface at the contact via hole 119h3 with respect to the top surface of the substrate 10. As the counter electrode 150 disposed on the side surface of the via insulating layer 119 at the contact via hole 119h3 extends along the gentle slope of the contact via hole 119h3, the possibility that the counter electrode 150 is short-circuited inside the contact via hole 119h3 may be significantly reduced.

According to an exemplary embodiment, the organic emission layer 141, the first common layer 142, and the second common layer 143 may not be disposed in at least a portion of the contact area 300. Since the contact area 300 is an area at which the counter electrode 150 contacts with the common voltage line ELVSS to reduce an IR drop, in an exemplary embodiment of manufacturing a display apparatus, portions of the organic emission layer 141 disposed on at least a portion of the common voltage line ELVSS, the first common layer 142 and the second common layer 143 may be removed using a laser or the like.

In an exemplary embodiment of manufacturing a display apparatus, after at least portions of the organic emission layer 141, the first common layer 142 and the second common layer 143 corresponding to the contact area 300 are removed to expose the common voltage line ELVSS, the counter electrode 150 is disposed, thereby brining the common voltage line ELVSS in contact with the counter electrode 150. In other words, the first common layer 142 and the second common layer 143 may be disposed throughout an entirety of the pixels P1 and P2 except in at least a portion of the contact area 300.

In a conventional method of manufacturing a display apparatus, when silver (Ag) is included in the common voltage line ELVSS and a laser beam is irradiated thereto to remove the first common layer 142 and the second common layer 143 disposed on the common voltage line ELVSS, some Ag particles may escape and collect on the via insulating layer 119, and thus defects may be caused in subsequent operations.

Therefore, in one or more embodiment of the invention, the common voltage line ELVSS may include a material that is less damaged during a laser irradiation. According to some embodiments, the common voltage line ELVSS may not include silver (Ag). In an exemplary embodiment, for example, the common voltage line ELVSS may be a single film or a multilayered film including aluminum (Al), molybdenum (Mo), and titanium (Ti) or a triple layer including Mo/Al/Mo or Ti/Al/Ti.

In a conventional method of manufacturing a display apparatus, a method of bringing the common voltage line ELVSS in contact with the counter electrode 150 in the contact area 300 by using a contact conductive layer that is disposed in a same layer and includes a same material as the pixel sub-electrode 130R may be used. However, since the pixel sub-electrode 130R may include Ag that causes the pixel sub-electrode 130R to function as a reflective layer, the contact conductive layer may also include Ag. In this case, Ag particles may escape during a laser irradiation and cause defects in subsequent operations.

According to embodiments, since the common voltage line ELVSS directly contacts the counter electrode 150 without using a contact conductive layer including a same material as the pixel sub-electrode 130R, the defects as described above may be minimized.

Each of the organic light-emitting display apparatuses 1, 2 and 3 according to the above-described embodiments include the contact area 300 in which the common voltage line ELVSS and the counter electrode 150 or 250 directly contact each other, and the via insulating layer 119, which exposes the common voltage line ELVSS, includes the contact via hole 119h3 with a stepped side surface.

In other words, the contact area 300 may prevent disconnection of the counter electrodes 150 and 250 and reduce an IR drop of the organic light-emitting display apparatuses 1, 2 and 3.

FIGS. 8A through 8D are cross-sectional diagrams showing operations in an exemplary embodiment of a method of manufacturing an organic light-emitting display apparatus according to the invention. FIGS. 8A-8D show a structure of the organic light-emitting display apparatus 1 from FIGS. 3 and 4, but operations may be similarly applied in forming the structures of the organic light-emitting display apparatus 2 or 3 from FIGS. 5-7.

Figure 8A:
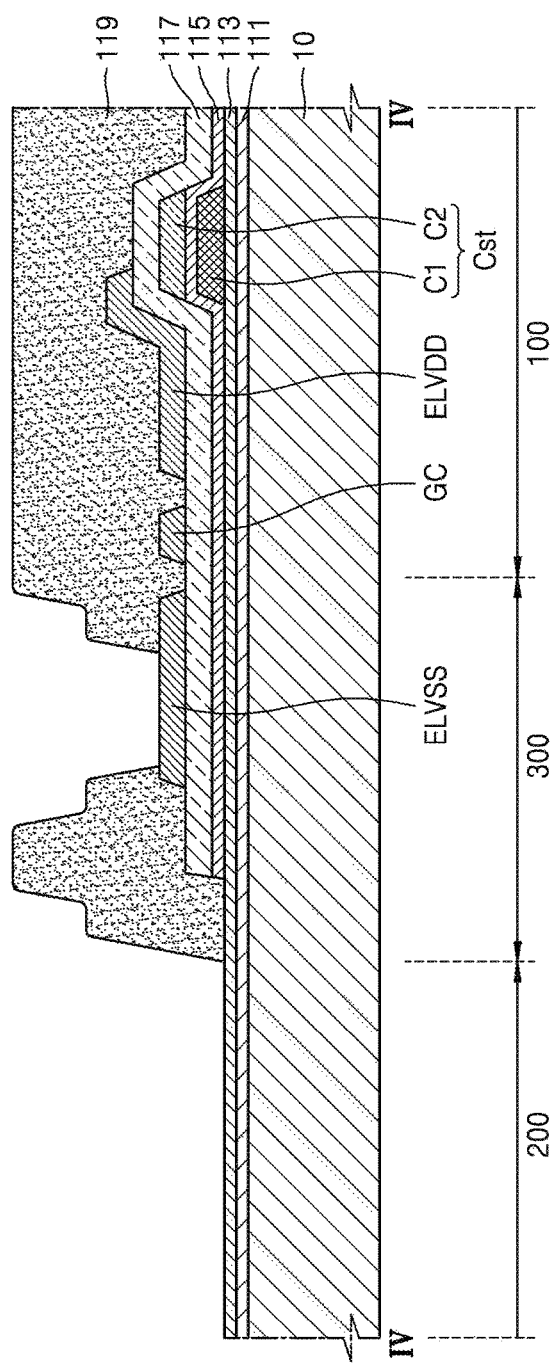
FIGS. 8A through 8D are cross-sectional diagrams showing operations in an exemplary embodiment of a method of manufacturing an organic light-emitting display apparatus according to the invention.

Referring to FIG. 8A, a buffer layer 111 is formed on a substrate 10. A pixel circuit DC (FIG. 2B) including at least one TFT and at least one capacitor Cst, a driving voltage line ELVDD for applying a driving voltage to the pixel circuit DC, and a common voltage line ELVSS are formed in a first area 100, on the buffer layer 111. At least a portion of the common voltage line ELVSS is formed in the contact area 300, such as by a portion of the common voltage line ELVSS in the first area 100 extending to be disposed in the contact area 300.

A first insulation layer 113, a second insulation layer 115 and a third insulation layer 117 may be disposed between the buffer layer 111 and each of the driving voltage line ELVDD and the common voltage line ELVSS. Each of the first insulation layer 113, the second insulation layer 115 and the third insulation layer 117 may be a single film or a double film including an inorganic material, such as silicon nitride ($SiN_x$) and/or silicon oxide ($SiO_2$). At least one of the first insulation layer 113, the second insulation layer 115 and the third insulation layer 117 may have an opening defined therein corresponding to a second area 200.

The driving voltage line ELVDD and the common voltage line ELVSS may be formed simultaneously using a same material and/or a same material layer. In other words, after a conductive material layer for forming the driving voltage line ELVDD and the common voltage line ELVSS is formed on the entire surface of the substrate 10, the driving voltage line ELVDD and the common voltage line ELVSS may be formed by patterning the conductive material layer.

Each of the driving voltage line ELVDD and the common voltage line ELVSS may include a single film or a multi-layered film including one or more materials from among aluminum (Al), platinum (Pt), palladium (Pd), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu). According to an exemplary embodiment, each of the driving voltage line ELVDD and the common voltage line ELVSS may include a triple layer including Mo/Al/Mo or Ti/Al/Ti.

A via insulating layer 119 covering the capacitor Cst, the driving voltage line ELVDD and the common voltage line ELVSS is formed. The via insulating layer 119 includes a contact via hole 119h3 defined therein that exposes a portion of the common voltage line ELVSS and a transmissive via hole 119h2 defined therein corresponding to the second area 200. The side surfaces of the via insulating layer 110 at the contact via hole 119h3 and at the transmissive via hole 119h2 may be stepped.

According to some embodiments, the via insulating layer 119 may include a photosensitive organic material. In this case, after the photosensitive organic material to form the via insulating layer 119 is applied to the entire surface of the substrate 10, exposures for portions of the photosensitive organic material where the transmissive via hole 119h2 and the contact via hole 119h3 of the via insulating layer 119 are to be formed may be differentiated by using a slit mask or a half-tone mask. Thus particular portions of the photosensitive organic material may be etched (removed) relatively more than the remaining portion thereof. Furthermore, by making an organic material constituting the via insulating layer 119 flowable downward toward the substrate via an additional thermal reflowing operation, angles of inclinations of edge portions of the inner side surfaces of the via insulating layer 119 at the transmissive via hole 119h2 and at the contact via hole 119h3 may be controlled.

Figure 8B:
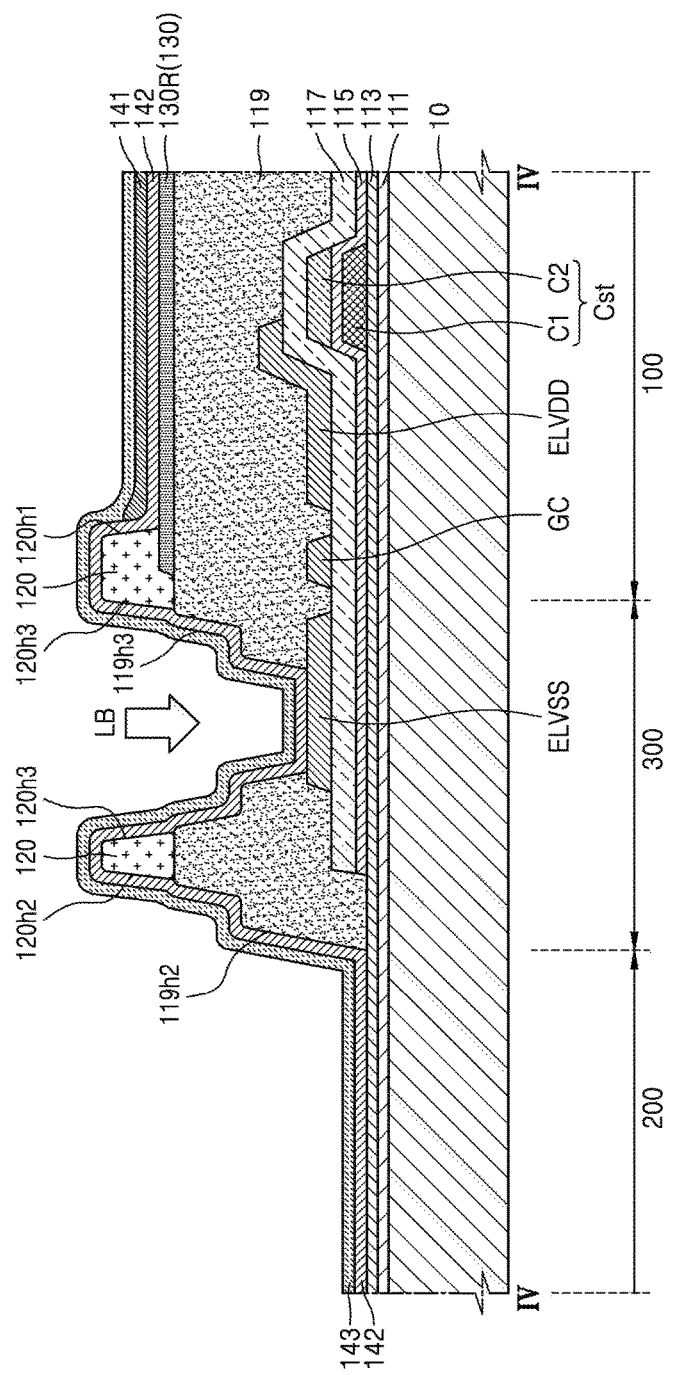

Referring to FIG. 8B, a pixel electrode 130 and a pixel-defining layer 120 which covers edges of the pixel electrode 130, such as opposing edges thereof, are formed on the via insulating layer 119.

A pixel sub-electrode 130R is a reflective electrode and may include at least one reflective layer including a material selected from Ag, Mg, Al, Pt, Pd, Au, Ni, Nd, Ir, Cr, and combinations thereof. According to an exemplary embodiment, the pixel sub-electrode 130R may further include a transparent or semi-transparent electrode layer disposed on top of and/or below the reflective layer. According to some embodiments, the pixel sub-electrode 130R may include Ag/ITO/Ag.

The pixel-defining layer 120 has a first opening 120h1 defined therein that exposes the pixel sub-electrode 130R and a second opening 120h2 defined therein corresponding to the second area 200. Furthermore, the pixel-defining layer 120 includes a third opening 120h3 defined therein corresponding to the contact via hole 119h3 to expose the common voltage line ELVSS. According to some embodiments, the pixel-defining layer 120 may include a photosensitive organic material.

An intermediate layer 140 including an organic emission layer 141 is formed on the portion of the pixel sub-electrode 130R exposed by the first opening 120h1. The intermediate layer 140 may include a first common layer 142 and a second common layer 143 in addition to the organic emission layer 141. The first common layer 142 and the second common layer 143 are formed throughout the substrate 10, such as to be disposed on an entirety thereof commonly disposed in each of the pixels of the display apparatus. The first common layer 142 and the second common layer 143 are disposed on an upper surface of the via insulating layer 119, and portions thereof extend into the third opening 120h3 and the contact via hole 119h3 to cover the exposed portion of the common voltage line ELVSS.

Figure 8C:
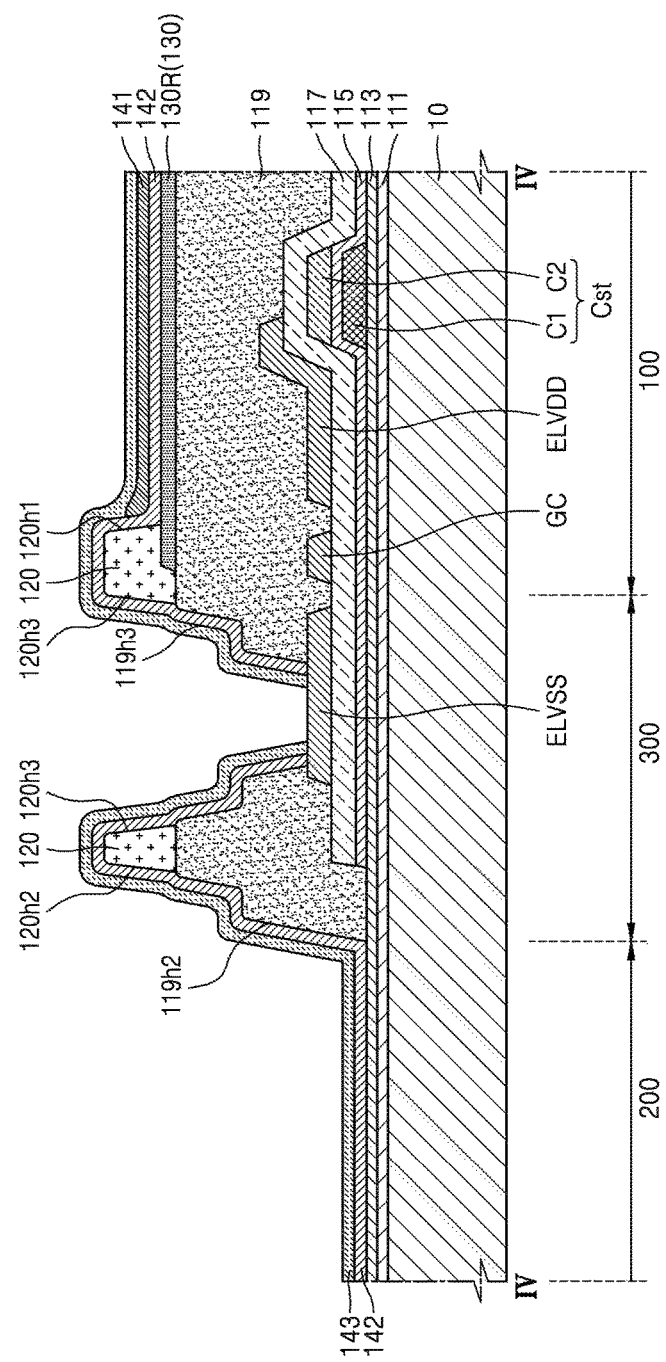
Figure 8D:
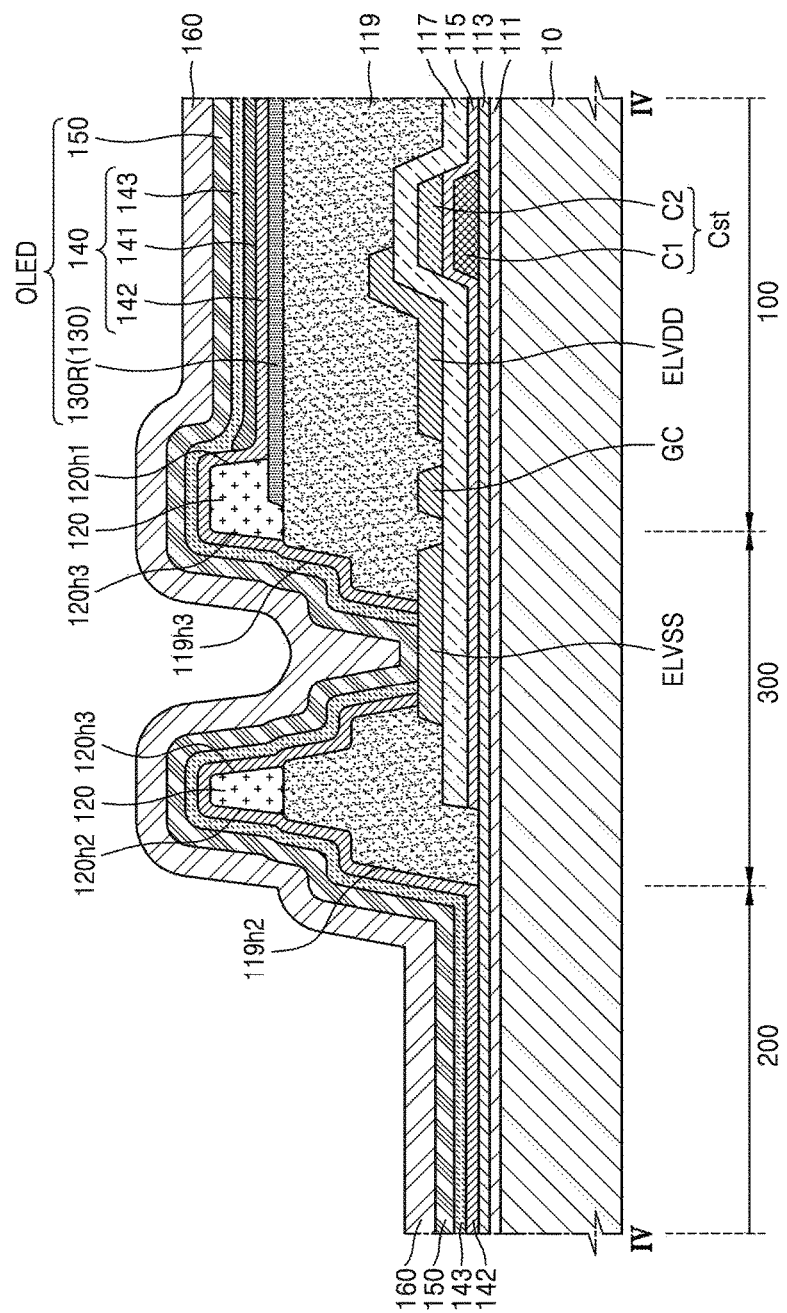

As shown in FIGS. 8B and 8C, a focused laser beam LB is irradiated to the contact area 300, thereby performing a laser drilling for removing the first common layer 142 and the second common layer disposed in the contact area 300. The removing of the portions of the first common layer 142 and the second common layer disposed in the contact area 300 re-expose a portion of the common voltage line ELVSS, as shown in FIG. 8D.

In a conventional method of manufacturing a display apparatus, when silver (Ag) is included in the common voltage line ELVSS and a laser beam is irradiated thereto to remove the first common layer 142 and the second common layer 143 disposed on the common voltage line ELVSS, some Ag particles may escape and collect on the via insulating layer 119, and thus defects may be caused in subsequent operations.

Therefore, in one or more embodiment of the invention, the common voltage line ELVSS may include a material that is less damaged during a laser irradiation. According to some embodiments, the common voltage line ELVSS may not include silver (Ag). In an exemplary embodiment, for example, the common voltage line ELVSS may be a single film or a multilayered film including aluminum (Al), molybdenum (Mo), and titanium (Ti) or a triple layer including Mo/Al/Mo or Ti/Al/Ti.

In a conventional method of manufacturing a display apparatus, a method of bringing the common voltage line ELVSS in contact with a counter electrode 150 in the contact area 300, by using a contact conductive layer that is disposed in a same layer and includes a same material as the pixel sub-electrode 130R, may be used. However, since the pixel sub-electrode 130R may include Ag that causes the pixel sub-electrode 130R to function as a reflective layer, the contact conductive layer may also include Ag. In this case, Ag particles may escape during a laser irradiation and cause defects in subsequent operations.

According to one or more embodiment of the invention, since the common voltage line ELVSS directly contacts the counter electrode 150, without using a contact conductive layer including a same material as the pixel sub-electrode 130R, the defects as described above may be minimized.

As shown in FIG. 8D, the counter electrode 150 and a protection layer 160 are formed.

The counter electrode 150 may include a transparent or semitransparent electrode, may include one or more materials selected from among Ag, Al, Mg, Li, Ca, Cu, LiF/Ca, LiF/Al, MgAg, and CaAg, and may be disposed as thin film having a thickness from several to several dozens of nanometers.

After the counter electrode 150 is formed, an operation for improving contacting characteristics between the counter electrode 150 and the common voltage line ELVSS, by irradiating a laser beam onto the counter electrode 150 in the contact area 300, may be additionally performed. In this case, since the counter electrode 150 and the common voltage line ELVSS directly contact each other, the contact characteristics thereof may be improved even with a relatively weak laser beam. However, in exemplary embodiments, such a laser irradiating operation may be omitted.

A protection layer 160 may be further disposed on the counter electrode 150. The protection layer 160 may cover and protect the organic light-emitting device OLED. The protection layer 160 may employ an inorganic insulation film and/or an organic insulation film.

The protection layer 160 may be deposited by using various deposition methods, such as PECVD, APCVD and LPCVD. The protection layer 160 is not a necessary component and may be omitted in some embodiments.

According to an exemplary embodiment, the organic light-emitting display apparatus 1 may be sealed with a sealing substrate (not shown) or a thin-film encapsulating layer (not shown). The sealing substrate or the thin-film encapsulating layer serves to shield the display layer 20 (FIG. 1) including the organic light-emitting device OLED from the external moisture or the air. The sealing substrate may include various plastic substrates, such as an acrylic substrate, as well as a glass substrate, or may even include a metal plate. The thin-film encapsulating layer may include at least one organic layer and at least one inorganic layer. A polarizing layer or a color converting layer may be further included on the sealing substrate or the thin-film encapsulating layer in some cases.

When sealed with a sealing substrate, a filler (not shown) may be further disposed between the counter electrode 150 and the sealing substrate to protect the display layer 20 (FIG. 1) from external shocks.

As described above, according to one or more exemplary embodiment, since a common voltage line and a counter electrode directly contact each other at a contact via hole formed in a via insulating layer, an organic light-emitting display apparatus capable of reducing an IR drop of the counter electrode and minimizing possible defects during a laser drilling may be provided.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made thereto without departing from the spirit and scope as defined by the following claims.

What is claimed is:

1. An organic light-emitting display apparatus comprising:
   a substrate;
   a common voltage line on the substrate;
   a pixel on the substrate, the pixel comprising:
     a first area at which light is generated and emitted, and
     a contact area adjacent to the first area, at which the common voltage line is electrically connected to the pixel;
   a pixel electrode in the first area of the pixel;
   a pixel-defining layer in the first area of the pixel, the pixel-defining layer comprising a first opening defined therein to expose a portion of the pixel electrode in the first area of the pixel;
   a via insulating layer disposed closer to the substrate than the pixel-defining layer, the via insulating layer comprising a contact via hole defined therein in the contact area, the contact via hole exposing a portion of the common voltage line;
   an intermediate layer on the exposed portion of the pixel electrode, the intermediate layer comprising an organic emission layer at which the light is generated; and
   a counter electrode on the intermediate layer, the counter electrode in direct contact with the common voltage line at the contact via hole in the contact area.

2. The organic light-emitting display apparatus of claim 1, wherein a side surface of the via insulating layer at the contact via hole has a stepped shape.

3. The organic light-emitting display apparatus of claim 1, wherein the intermediate layer on the exposed portion of the pixel electrode extends to be disposed along a side surface of the via insulating layer at the contact via hole in the contact area of the pixel.

4. The organic light-emitting display apparatus of claim 1, wherein the intermediate layer further comprises a common layer,
   wherein the common layer is on the organic emission layer, in the first area of the pixel, the common layer extending from the first area to the contact area of the pixel to expose the common voltage line at the contact via hole in the contact area.

5. The organic light-emitting display apparatus of claim 1, further comprising a pixel circuit electrically connected to the pixel electrode to drive the pixel,
   wherein the pixel circuit comprises a thin-film transistor and a capacitor in the first area of the pixel.

6. The organic light-emitting display apparatus of claim 1, wherein
   the pixel comprises a first sub-pixel, a second sub-pixel and a third sub-pixel, and
   within the pixel, the pixel electrode comprises a first pixel sub-electrode, a second pixel sub-electrode and a third pixel sub-electrode disposed in the first sub-pixel, the second sub-pixel and the third sub-pixel, respectively.

7. The organic light-emitting display apparatus of claim 6, wherein within the pixel, the contact area of the pixel is adjacent to a pixel sub-electrode having the smallest planar area from among those of the first pixel sub-electrode, the second pixel sub-electrode and the third pixel sub-electrode.

8. The organic light-emitting display apparatus of claim 1, wherein
   the pixel further comprises a second area through which external light is transmitted, and
   the pixel-defining layer comprises a second opening defined therein corresponding to the second area through which the external light transmits.

9. The organic light-emitting display apparatus of claim 8, wherein
   the via insulating layer further comprises a transmissive via hole defined therein corresponding to the second area through which the external light transmits, and
   a side surface of the via insulating layer at the transmissive via hole has a stepped shape.

10. The organic light-emitting display apparatus of claim 1, wherein
    the pixel electrode is a reflective electrode, and
    the counter electrode is a transparent or semi-transparent electrode.

11. An organic light-emitting display apparatus comprising:
    a substrate; and
    a pixel on the substrate, the pixel comprising:
      a common voltage line on the substrate;
      a first area at which light is generated and emitted;
      a second area at which external light is transmitted;

a contact area between the first area and the second area, at which the common voltage line is electrically connected to the pixel;

a pixel electrode in the first area;

a pixel-defining layer in the first area, the pixel-defining layer comprising a first opening defined therein to expose a portion of the pixel electrode and a second opening defined therein corresponding to the second area;

a via insulating layer on the common voltage line, the via insulating layer comprising a contact via hole defined therein to expose a portion of the common voltage line at the contact area and a transmissive via hole defined therein corresponding to the second area;

an intermediate layer on the exposed portion of the pixel electrode in the first area, comprising an organic emission layer at which the light is generated; and a counter electrode on the intermediate layer, the counter electrode in direct contact with the common voltage line at the contact via hole in the via insulating layer, wherein the common voltage line is disposed on a different layer from the pixel electrode, and a side surface of the via insulating layer at the transmissive via hole has a stepped shape.

12. The organic light-emitting display apparatus of claim 11, wherein a side surface of the via insulating layer at the contact via hole has a stepped shape.

13. The organic light-emitting display apparatus of claim 11, wherein the pixel electrode comprises silver, and the common voltage line does not comprise silver.

14. The organic light-emitting display apparatus of claim 11, wherein the counter electrode directly contacting the common voltage line at the contact via hole in the via insulating layer comprises an opening defined therein corresponding to the second area.

15. The organic light-emitting display apparatus of claim 11, wherein a ratio of a total planar area of the second area of the pixel to a total planar area of the pixel is from about 40% to about 90%.

16. The organic light-emitting display apparatus of claim 11, wherein a portion of the common voltage line directly connected to the counter electrode at the contact via hole in the via insulating layer is disposed in the first area.

17. The organic light-emitting display apparatus of claim 11, wherein the pixel comprises a first sub-pixel, a second sub-pixel and a third sub-pixel which emit light of different colors, and within the pixel, the pixel electrode comprises a first pixel sub-electrode, a second pixel sub-electrode and a third pixel sub-electrode in the first sub-pixel, the second sub-pixel and the third sub-pixel, respectively.

18. The organic light-emitting display apparatus of claim 17, wherein the first sub-pixel, the second sub-pixel and the third sub-pixel emit red light, green light and blue light, respectively, and the first pixel sub-electrode, the second pixel sub-electrode and the third pixel sub-electrode have different planar areas from each other.

19. The organic light-emitting display apparatus of claim 18, wherein within the pixel, the contact area is adjacent to a pixel sub-electrode having the smallest planar area from among those of the first pixel sub-electrode, the second pixel sub-electrode and the third pixel sub-electrode.

20. The organic light-emitting display apparatus of claim 11, wherein the the common voltage line at least partially overlaps the pixel electrode.

* * * * *